(12) United States Patent
Liu et al.

(10) Patent No.: US 12,713,557 B2
(45) Date of Patent: Aug. 18, 2026

(54) HEAT DISSIPATION APPARATUS AND ELECTRONIC DEVICE

(71) Applicant: Lenovo (Beijing) Limited, Beijing (CN)

(72) Inventors: Fang Liu, Beijing (CN); Xin He, Beijing (CN)

(73) Assignee: LENOVO (BEIJING) LIMITED, Beijing (CN)

( * ) Notice: Subject to any disclaimer, the term of this patent is extended or adjusted under 35 U.S.C. 154(b) by 188 days.

(21) Appl. No.: 18/432,880

(22) Filed: Feb. 5, 2024

(65) Prior Publication Data

US 2024/0292566 A1 Aug. 29, 2024

(30) Foreign Application Priority Data

Feb. 24, 2023 (CN) ......................... 202310184000.0

(51) Int. Cl.

| | |
|---|---|
| ***H05K 7/20*** | (2006.01) |
| *B60H 1/32* | (2006.01) |
| *F04B 9/00* | (2006.01) |
| *F16K 1/00* | (2006.01) |

(52) U.S. Cl.

CPC ..... *H05K 7/20272* (2013.01); *H05K 7/20372* (2013.01); *B60H 1/32* (2013.01); *F04B 9/00* (2013.01); *F16K 1/00* (2013.01)

(58) Field of Classification Search

None

See application file for complete search history.

(56) References Cited

U.S. PATENT DOCUMENTS

| | | | | |
|---|---|---|---|---|
| 12,426,203 | B2 * | 9/2025 | Hu | H05K 7/20272 |
| 2006/0042246 | A1 * | 3/2006 | Gray | F02B 37/18 60/600 |
| 2010/0277865 | A1 * | 11/2010 | Goth | F25B 49/02 361/679.53 |
| 2017/0150646 | A1 * | 5/2017 | Verronen | F04D 13/06 |
| 2021/0069717 | A1 * | 3/2021 | Schwertner | B01L 3/502715 |
| 2023/0096875 | A1 * | 3/2023 | Edmunds | H05K 7/20772 361/689 |
| 2023/0398838 | A1 * | 12/2023 | Jung | B60H 1/32 |
| 2025/0054779 | A1 * | 2/2025 | Wang | H01L 21/67253 |

* cited by examiner

*Primary Examiner* — Courtney L Smith

(74) *Attorney, Agent, or Firm* — ANOVA LAW GROUP, PLLC

(57) ABSTRACT

A heat dissipation apparatus and electronic device are provided. The heat dissipation apparatus includes a first branch pipeline, capable of accommodating a heat dissipation medium and configured for dissipating heat for the first heating element; a second branch pipeline, capable of accommodating a heat dissipation medium and configured for dissipating heat for the second heating element; a connection pipeline, two ends of the connection pipeline being connected to the first branch pipeline and the second branch pipeline respectively; an output pipeline, connected to the connection pipeline; and a moving member, movably arranged in the connection pipeline and capable of moving toward the first branch pipeline side or the second branch pipeline side in the connection pipeline to adjust a communication area between the first branch pipeline the output pipeline and a communication area between the second branch pipeline and the output pipeline.

20 Claims, 3 Drawing Sheets

HEAT DISSIPATION APPARATUS AND ELECTRONIC DEVICE

CROSS-REFERENCE TO RELATED APPLICATION

This application claims priority of Chinese Patent Application No. 2023101840000, filed on Feb. 24, 2023, the entire contents of which are hereby incorporated by reference.

FIELD OF THE DISCLOSURE

The present disclosure generally relates to the field of cooling technology and, more particularly, relates to a heat dissipation apparatus and an electronic device.

BACKGROUND

Heat dissipation apparatuses are commonly used in electronic devices. However, current heat dissipation apparatuses exhibit a singular form and limited adaptability.

BRIEF SUMMARY OF THE DISCLOSURE

One aspect of the present disclosure provides a heat dissipation apparatus. The heat dissipation apparatus includes a first branch pipeline, capable of accommodating a heat dissipation medium and configured for dissipating heat for the first heating element; a second branch pipeline, capable of accommodating a heat dissipation medium and configured for dissipating heat for the second heating element; a connection pipeline, two ends of the connection pipeline being connected to the first branch pipeline and the second branch pipeline respectively; an output pipeline, connected to the connection pipeline; and a moving member, movably arranged in the connection pipeline and capable of moving toward the first branch pipeline side or the second branch pipeline side in the connection pipeline to adjust a communication area between the first branch pipeline the output pipeline and a communication area between the second branch pipeline and the output pipeline.

Another aspect of the present disclosure provides an electronic device. The electronic device includes a first heating element, a second heating element, a heat dissipation apparatus. The heat dissipation apparatus includes a first branch pipeline, capable of accommodating a heat dissipation medium and configured for dissipating heat for the first heating element; a second branch pipeline, capable of accommodating a heat dissipation medium and configured for dissipating heat for the second heating element; a connection pipeline, two ends of the connection pipeline being connected to the first branch pipeline and the second branch pipeline respectively; an output pipeline, connected to the connection pipeline; and a moving member, movably arranged in the connection pipeline and capable of moving toward the first branch pipeline side or the second branch pipeline side in the connection pipeline to adjust a communication area between the first branch pipeline the output pipeline and a communication area between the second branch pipeline and the output pipeline. The first branch pipeline is configured to dissipate heat for the first heating element. The second branch pipeline is configured to dissipate heat for the second heating element.

Other aspects of the present disclosure can be understood by a person skilled in the art in light of the description, the claims, and the drawings of the present disclosure.

Figure 1:
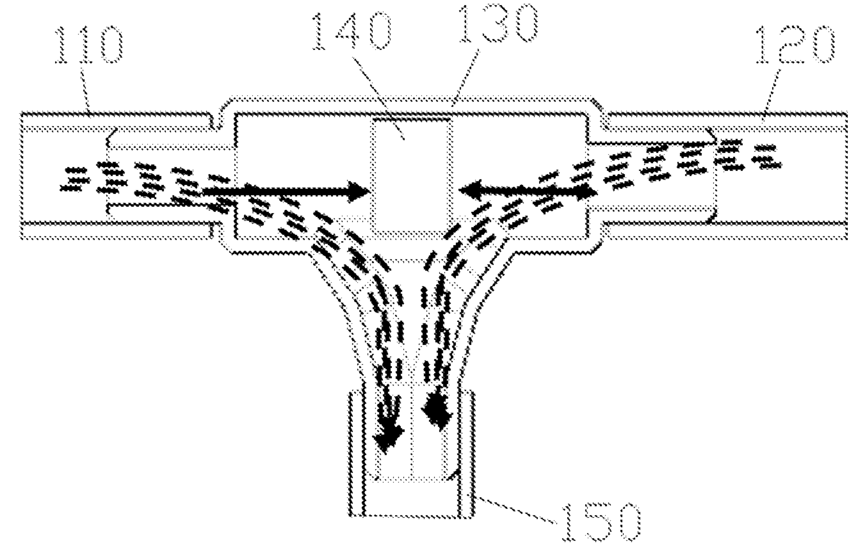
FIG. 1 illustrates an optional partial diagram of a heat dissipation apparatus consistent with various embodiments of the present disclosure.

Reference numeral list: 110—first branch pipeline; 120—second branch pipeline; 130—connection pipeline; 131—first pipeline part; 132—second pipeline part; 133—first limiting chamber; 134—first port; 135—second port; 140—moving member; 150—output pipeline; 160—input pipeline; 170—first heat dissipation block; 171—first heat dissipation chamber; 172—first inlet; 173—first outlet; 174—first capillary structure; 180—second heat dissipation block; 181—second heat dissipation chamber; 182—second inlet; 183—second outlet; 191—first heating element.

DETAILED DESCRIPTION

Technical solutions of the present disclosure will be further described in detail below with reference to accompanying drawings and specific embodiments of the present specification.

In the embodiments of the present disclosure, unless otherwise explicitly specified, the term "connection" should be understood in a broad interpretation. For example, the "connection" may be a fixed connection, a detachable connection, or an integral connection; and may be a direct connection or an indirect connection using an intermediate medium. For a person skilled in the art, specific meanings of the term can be understood according to specific circumstances.

In the embodiments of the present disclosure, terms "first\second\third" involved in the embodiments of the present disclosure are only used to distinguish similar objects and do not represent a specific sequence of the objects. It can be understood that "first/second/third" may be interchanged to specific sequences or orders if allowed to implement the embodiments of the disclosure described herein in sequences except the illustrated or described ones.

A heat dissipation apparatus described in the embodiments of the present disclosure will be described in detail below with reference to FIGS. 1-6.

The heat dissipation apparatus includes a first branch pipeline 110, a second branch pipeline 120, a connection pipeline 130, an output pipeline 150 and a moving member 140. The first branch pipeline 110 is configured to accommodate a heat dissipation medium and dissipate heat for the first heating element 191. The second branch pipeline 120 is configured to accommodate the heat dissipation medium and dissipate heat for a second heating element. Two ends of the connection pipeline 130 are connected to the first branch pipeline 110 and the second branch pipeline 120 respectively. The output pipeline 150 is connected to the connection pipeline 130. The moving member 140 is movably arranged in the connection pipeline 130. The moving member 140, by moving within the connection pipeline 130 toward either the first or second branch pipeline, can adjust a communication area between the first branch pipeline 110 and the output 150 and a communication area between the second branch pipeline 120 and the output pipeline 150. The heat dissipation medium has a gas state and a liquid state. By adjusting the communication area between the first branch pipeline 110 and the output pipeline 150 and the communication area between the second branch pipeline 120 and the output pipeline 150 through the moving member 140, flow rates of the heat dissipation medium distributed in the first branch pipeline 110 and the second branch pipeline 120 can be adjusted, and a heat dissipation performance of the first branch pipeline 110 and the second branch pipeline 120 can be adjusted, so that a heat dissipation form of the heat dissipation apparatus can be adjusted, which greatly improves a adaptability of the heat dissipation apparatus.

A form of the heat dissipation medium is not limited herein, as long as the heat dissipation medium exists in gas and liquid states, to absorb heat through a state change of the heat dissipation medium. For example, the heat dissipation medium can be water.

A method by which the first branch pipeline 110 dissipates heat for the first heating element 191 is not limited herein. For example, the first branch pipeline 110 may directly contact the first heating element 191. For another example, the first branch pipeline 110 may contact the first heating element 191 through other structures.

A structure of the first heating element 191 is not limited herein. For example, the first heating element 191 can be a heat-generating chip, a processor, or a memory.

A method of using the second branch pipeline 120 to dissipate heat for the second heating element is not limited herein. For example, the second branch pipeline 120 may directly contact the second heating element. For another example, the second branch pipeline 120 may contact the second heating element through other structures.

A structure of the second heating element is not limited. For example, the second heat-generating element may be a heat-generating chip, a processor, or a memory.

In one embodiment, two ends of the connection pipeline 130 are connected to the first branch pipeline 110 and the second branch pipeline 120 respectively. The output pipeline 150 is connected to the connection pipeline 130 so that the heat dissipation medium of the first branch pipeline 110 and the second branch pipeline 120 flows into the output pipeline 150 through the connection pipeline 130.

In one embodiment, the moving member 140 can move within the connection pipeline 130 based on a pressure of the heat dissipation medium of the first branch pipeline 110 and a pressure of the heat dissipation medium of the second branch pipeline 120.

As shown in FIG. 1, since two ends of the connection pipeline 130 are connected to the first branch pipeline 110 and the second branch pipeline 120 respectively, a pressure difference between the heat dissipation medium in the first branch pipeline 110 and the second branch pipeline 120 can induce a movement of the moving member 140 within the connection pipeline 130. After absorbing heat, at least part of the heat dissipation medium in the first branch pipeline 110 and the second branch pipeline 120 will undergo a phase change, transitioning from the liquid state to the gas state. As the heat dissipation medium in the first branch pipeline 110 and the second branch pipeline 120 absorbs more heat, more of the heat dissipation medium converts from liquid to gas. The higher a proportion of the heat dissipation medium in the gas state, the greater the pressures in the first branch pipeline 110 and the second branch pipeline 120.

When the first heating element 191 generates more heat, the first branch pipeline 110 absorbs more heat and the more the heat dissipation medium in the first branch pipeline 110 is converted from the liquid state to the gas state. As the pressure of the heat dissipation medium in the first branch pipeline 110 is greater than the pressure of the heat dissipation medium in the second branch pipeline 120, the moving member 140 may move toward the second branch pipeline 120. Therefore, a communication area between the first branch pipeline 110 and the output pipeline 150 increases, and a flow rate of the heat dissipation medium in the first branch pipeline 110 increases, thereby improving a heat dissipation capacity of the first branch pipeline 110. When the pressure of the heat dissipation medium in the first branch pipeline 110 is substantially equal to the pressure of the heat dissipation medium in the second branch pipeline, the moving member 140 no longer moves, and the heat dissipation apparatus is in a generally balanced state. When heat generated by the first heating element 191 decreases, the moving member 140 will move toward the first branch pipeline 110. The heat dissipation apparatus can automatically adjust the flow rates of the heat dissipation medium in the first branch pipeline 110 and the second branch pipeline 120 based on calorific values of the first heating element 191 and the second heating element, thereby automatically adjusting the heat dissipation capabilities of the first branch pipeline 110 and the second branch pipeline 120, and greatly improving the adaptability of the heat dissipation apparatus.

In the heat dissipation apparatus, if no moving member is arranged, when the heat generated by the first heating element is higher, the increased pressure of the heat dissipation medium in the first branch pipeline drives more flow to the second branch pipeline, thereby further reducing the heat dissipation capacity of the first branch pipeline, causing the pressure of the heat dissipation medium in the first branch pipeline to further increase, and potentially causing blockage and an inability to dissipate heat for the first heating element.

In the present disclosure, the moving member 140 can also move within the connection pipeline 130 through other power sources. For example, the moving member 140 is made of iron, and a first electromagnetic structure and a second electromagnetic structure can be arranged at two ends of the connection pipeline 130. At least one of the first electromagnetic structure and the second electromagnetic structure can have magnetism when energized, thereby attracting the moving member 140 to move through magnetic force.

A structure of the moving member 140 is not limited herein. For example, the moving member 140 can be either a columnar structure or a spherical structure. For another example, the connection pipeline 130 has a circular cross-section, and the moving member 140 has a columnar structure, so that the moving member 140 moves smoothly within the connection pipeline 130.

To prevent impurities from entering the connection pipeline 130 to wear the moving member 140 or the connection pipeline 130, filter structures may be arranged at two ends of the connection pipeline 130. The filter structures can be metal filters or fabric filters.

Figure 2:
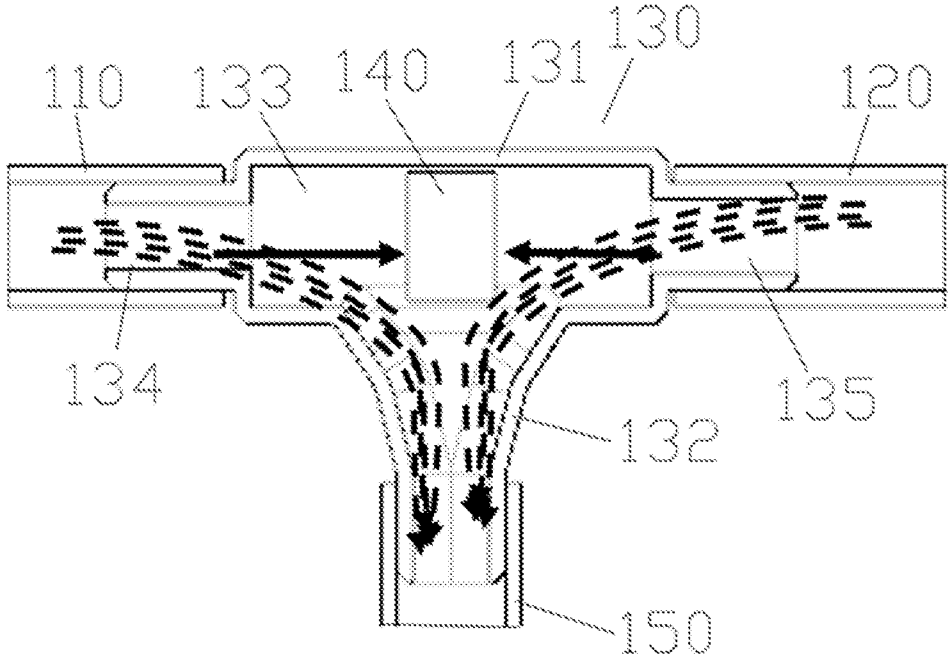
FIG. 2 illustrates another optional partial diagram of a heat dissipation apparatus consistent with various embodiments of the present disclosure.

In one optional implementation, as shown in FIG. 2, the connection pipeline 130 may include a first pipeline part 131 and a second pipeline part 132. Two ports of the first pipeline part 131 are respectively connected to a first end of the second branch pipeline 120 and a first end of the first branch pipeline 110. A first end of the second pipeline part 132 is connected to a side wall of the first pipeline part 131. A second end of the second pipeline part 132 is connected to a first end of the output pipeline 150. The moving member 140 can be movably arranged in the first pipeline part 131.

In one implementation, a cross-sectional shape of the first pipeline part 131 may be circular or elliptical. A cross-sectional shape of the second pipeline part 132 may be circular or elliptical. For example, the cross-sectional shape of the first pipeline part 131 may be circular, and the cross-section of the second pipeline part 132 may be elliptical.

To prevent the moving member 140 from falling into the second pipeline part 132, a chamber of the second pipeline part 132 may have a flat design with a height of the second pipeline part 132 in a second direction being smaller than a height of the moving member 140. To allow the heat dissipation medium in the first pipeline part 131 to flow into the second pipeline part 132 smoothly, a length of a first port 134 of the second pipeline part 132 in a first direction is greater than a length of a second port 135 of the second pipeline part 132 in the first direction.

Figure 3:
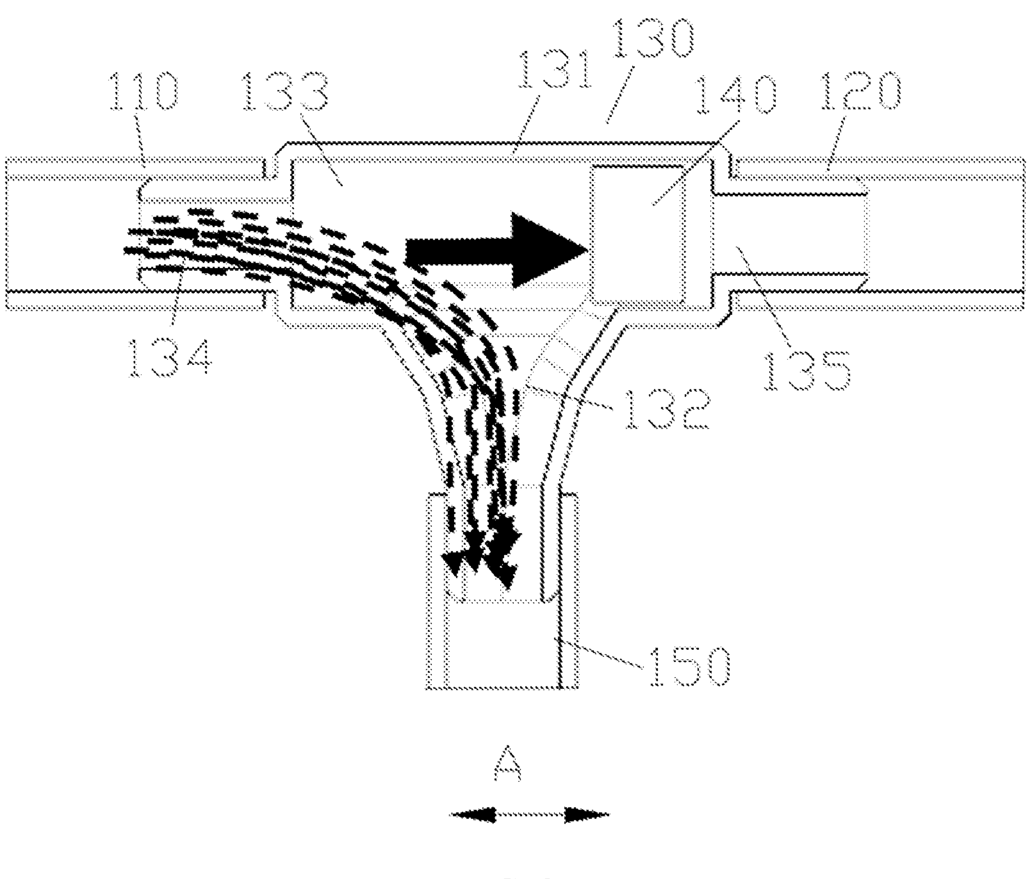
FIG. 3 illustrates another optional partial diagram of a heat dissipation apparatus consistent with various embodiments of the present disclosure.
Figure 4:
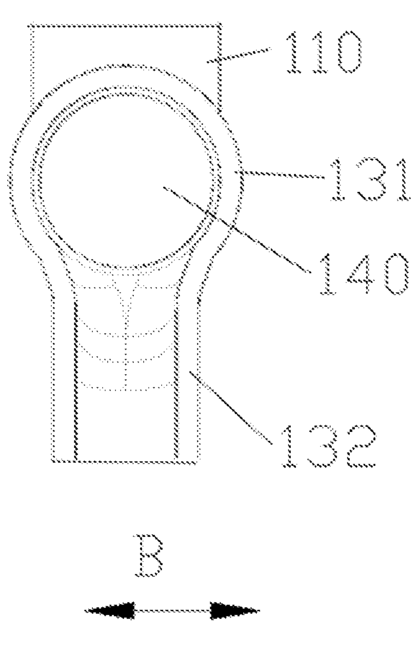
FIG. 4 illustrates another optional partial diagram of a heat dissipation apparatus consistent with various embodiments of the present disclosure.

The first direction, such as direction A shown in FIG. 3 is not limited herein. The second direction, such as direction B shown in FIG. 4 is not limited herein. For example, the second direction may satisfy a vertical condition with the first direction, and the vertical condition refers to being vertical or substantially vertical.

In one implementation, the first pipeline part 131 may include a first limiting chamber 133, the first port 134 and the second port 135. The first limiting chamber 133 is in a middle of the first pipeline part 131, and the first limiting chamber 133 is connected to the first end of the second pipeline part 132. A cross-sectional area of the first port 134 is smaller than a cross-sectional area of the first limiting chamber 133. The first port 134 is connected to the first limiting chamber 133 and the first end of the first branch pipeline 110 respectively. A cross-sectional area of the second port 135 is smaller than the cross-sectional area of the first limiting chamber 133. The second port 135 is connected to the first limiting chamber 133 and the first end of the second branch pipeline 120 respectively. The moving member 140 is movably arranged in the first limiting chamber 133. By arranging the moving member 140 in the first pipeline part 131 with smaller cross-sectional areas at two ends and a larger cross-sectional area in a middle, the moving member 140 can be prevented from falling out of the first pipeline part 131. An extreme movement position of the moving member 140 can be limited by the first port 134 and the second port 135.

When the first heating element 191 does not work, that is, when the first heating element 191 does not generate heat, the moving member 140 moves to a first limit position in the first limiting chamber 133. When the moving member 140 reaches the first limit position of the first limiting chamber 133, the moving member 140 blocks the first port 134, preventing a flow of heat dissipation medium in the first branch pipeline 110. Meanwhile, the heat dissipation medium in the second branch pipeline 120 is allowed to flow, enhancing a heat dissipation capability of the heat dissipation apparatus for the second heating element.

When the second heating element does not work, that is, when the second heating element does not generate heat, the moving member 140 moves to a second limit position in the first limiting chamber 133. When the moving member 140 reaches the second limit position the first limiting chamber 133, the moving member 140 blocks the second port 135, preventing a flow of heat dissipation medium in in the second branch pipeline 120. Meanwhile, the heat dissipation medium in the first branch pipeline 110 is allowed to flow, enhancing the heat dissipation capability of the heat dissipation apparatus for the first heating element 191.

When both the second heating element and the first heating element 191 are working, that is, when both the second heating element and the first heating element 191 generate heat, the moving member 140 moves between the first limit position and the second limit position in the first limiting chamber 133. When the moving member 140 is positioned between the first limit position and the second limit position in the first limiting chamber 133, the output pipeline 150 establishes communication with the first branch pipeline 110 and the second branch pipeline 120. The heat dissipation medium in both the first branch pipeline 110 and the second branch pipeline 120 are allowed to flow. Based on the calorific values of the first heating element 191 and the second heating element, the heat dissipation apparatus can automatically adjust the flow rates of the heat dissipation medium in the two branch pipelines, thereby enhancing the heat dissipation capacity of the heat dissipation apparatus.

Figure 5:
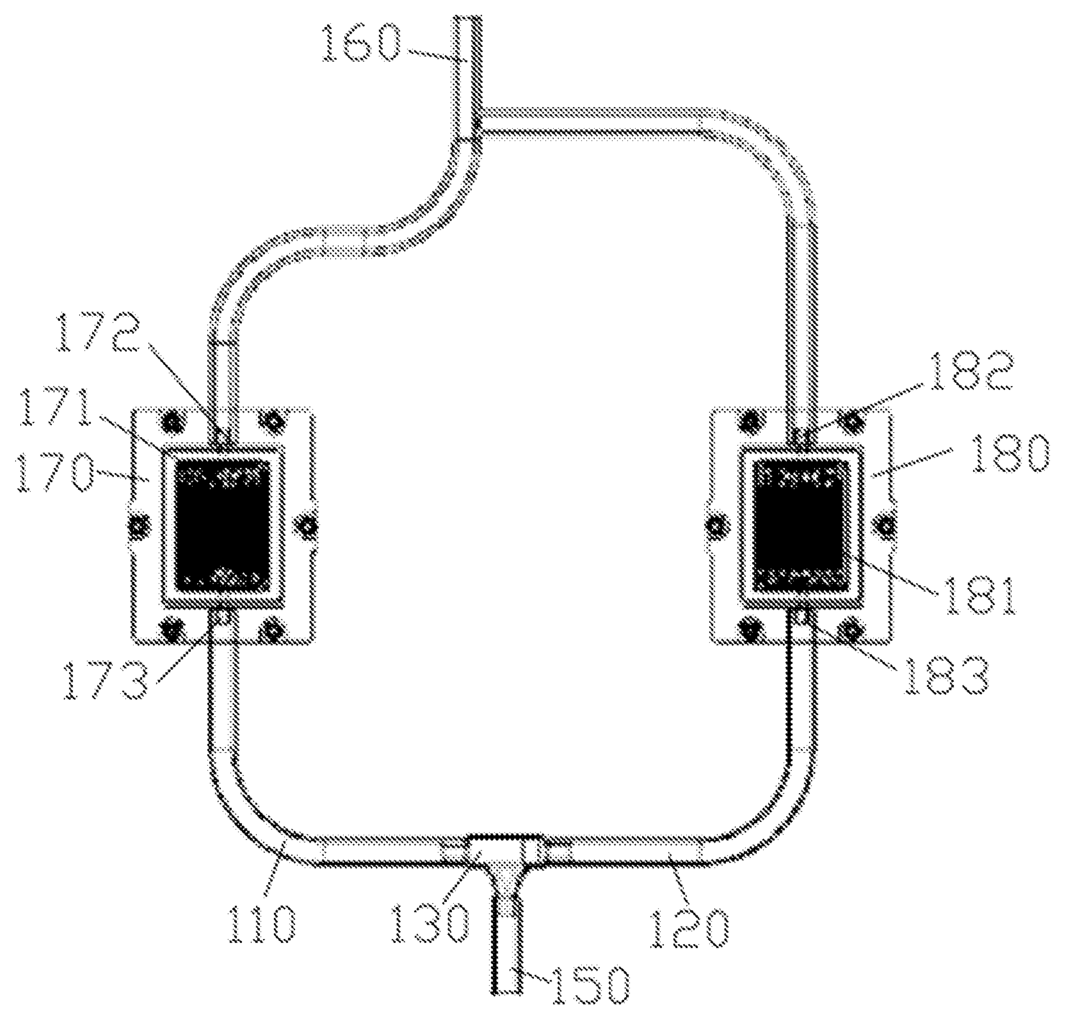
FIG. 5 illustrates another optional partial diagram of a heat dissipation apparatus consistent with various embodiments of the present disclosure.

As shown in FIG. 5, in one optional implementation, the heat dissipation apparatus may also include an input pipeline 160, a first heat dissipation block 170, a second heat dissipation block 180, a first filter member, and a second filter member. A first end of the input pipeline 160 is connected to a second end of the second branch pipeline 120 and a second end of the first branch pipeline 110 respectively. The first heat dissipation block 170 is configured to dissipate heat for the first heating element 191. The first heat dissipation block 170 includes a first heat dissipation chamber 171, a first inlet 172 and a first outlet 173. Two sections of the first branch pipeline 110 are respectively connected to the first inlet 172 and the first outlet 173. The second heat dissipation block 180 is configured to dissipate heat for the second heating element. The second heat dissipation block 180 includes a second heat dissipation chamber 181, a second inlet 182 and a second outlet 183. Two sections of the second branch pipeline 120 are respectively connected with the second inlet 182 and the second outlet 183. The first filter member is arranged at the first outlet 173 and the second filter member is arranged at the second outlet 183.

In the implementation, using the first heat dissipation block 170 with a larger area for the first heating element 191 and the second heat dissipation block 180 with a larger area for the second heating element enhances the heat dissipation capability of the heat dissipation apparatus.

Figure 6:
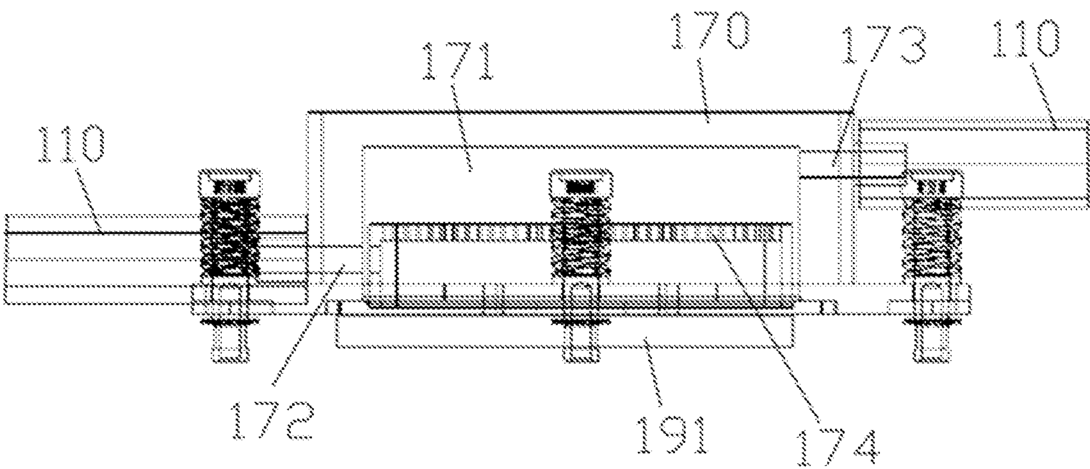
FIG. 6 illustrates another optional partial diagram of a heat dissipation apparatus consistent with various embodiments of the present disclosure.

As shown in FIG. 6, a first capillary structure 174 may also be arranged in the first heat dissipation chamber 171 so that more heat dissipation medium can be converted from the liquid state into the gas state through the first capillary structure 174. A second capillary structure may also be arranged in the second heat dissipation chamber 181.

It should be noted that when the first heat dissipation block 170 and the second heat dissipation block 180 are not arranged in the heat dissipation apparatus, the first capillary structure 174 may be arranged in the first branch pipeline 110, and the second capillary structure may be arranged in the second branch pipeline 120.

In the implementation, arranging the first filter member at the first outlet 173 and the second filter member at the second outlet 183 allows for a filtration of impurities in the heat dissipation medium and prevents impurities from entering the connection pipeline 130 and wearing the moving member 140 and the connection pipeline 130 during a movement of the moving member 140 within the connection pipeline 130, thereby enhancing the lifespan of both the moving member 140 and the connection pipeline 130.

When the first heat dissipation block 170 and the second heat dissipation block 180 are not arranged in the heat dissipation apparatus, the first filter member may be arranged in the first branch pipeline 110 and the second filter member may be arranged in the second branch pipeline 120.

One embodiment also provides an electronic device, which includes the heat dissipation apparatus provided by the above embodiments, a first heating element 191 and a second heating element. The first branch pipeline 110 is configured to dissipate heat for the first heating element 191 and the second branch pipeline 120 is configured to dissipate heat for the second heating element. By adjusting a communication area between the first branch pipeline 110 and the output pipeline 150 and a communication area between the second branch pipeline 120 and the output pipeline 150 through the moving member 140, flow rates of the heat dissipation medium distributed in the first branch pipeline 110 and the second branch pipeline 120 can be adjusted, and a heat dissipation performance of the first branch pipeline 110 and the second branch pipeline 120 can be adjusted, so that a heat dissipation form of the electronic device can be adjusted, which greatly improves an adaptability of the electronic device.

Structures of the first heating element 191 and the second heating element are not limited herein. For example, the first heating element 191 can be a memory and the second heating element 191 can be a processor. For another example, the first heating element 191 can be a first processor, and the second heating element can be a second processor.

As disclosed, the heat dissipation apparatus and the electronic device provided by the present disclosure at least realize the following beneficial effects.

The heat dissipation apparatus includes a first branch pipeline capable of accommodating a heat dissipation medium and configured for dissipating heat for a first heating element; a second branch pipeline capable of accommodating a heat dissipation medium and configured for dissipating heat for a second heating element; a connection pipeline, two ends of the connection pipeline being connected to the first branch pipeline and the second branch pipeline respectively; an output pipeline, connected to the connection pipeline; and a moving member, movably arranged in the connection pipeline and capable of moving toward the first branch pipeline or the second branch pipeline in the connection pipeline to adjust a communication area between the first branch pipeline and the output pipeline and a communication area between the second branch pipeline and the output pipeline. By adjusting the communication area between the first branch pipeline and the second branch pipeline and the output pipeline and a communication area between the second branch pipeline and the output pipeline through the moving member, flow rates of the heat dissipation medium distributed in the first branch pipeline and the second branch pipeline can be adjusted, and a heat dissipation performance of the first branch pipeline and the second branch pipeline can be adjusted, so that a heat dissipation form of the heat dissipation apparatus can be adjusted, which greatly improves an adaptability of the heat dissipation apparatus.

The above are only specific implementations of the present disclosure and are not used to limit the scope of the present disclosure. Any modifications, equivalent substitutions and improvements made within the spirit and principles of the present disclosure shall be included in the protection scope of the present disclosure. Therefore, the protection scope of the present disclosure should be subject to the protection scope of the claims.

What is claimed is:

1. A heat dissipation apparatus, comprising:

a first branch pipeline, capable of accommodating a heat dissipation medium and configured for dissipating heat for a first heating element;

a second branch pipeline, capable of accommodating the heat dissipation medium and configured for dissipating heat for a second heating element;

a connection pipeline, two ends of the connection pipeline being connected to the first branch pipeline and the second branch pipeline respectively;

an output pipeline, connected to the connection pipeline; and a moving member, movably arranged in the connection pipeline and capable of moving toward the first branch pipeline side or the second branch pipeline side in the connection pipeline to adjust a first communication area between the first branch pipeline and the output pipeline and a second communication area between the second branch pipeline and the output pipeline;

wherein the moving member and the connection pipeline are configured such that when the moving member is located in at least a part of the connection pipeline, both the first communication area and the second communication area are simultaneously greater than zero.

2. The heat dissipation apparatus according to claim 1, wherein the connection pipeline includes:

a first pipeline part, two ports of the first pipeline part being respectively connected to a first end of the second branch pipeline and a first end of the first branch pipeline;

a second pipeline part, a first end of the second pipeline part being connected to a side wall of the first pipeline part, and a second end of the second pipeline part being connected to the output pipeline; and the moving member being capable of movably arranged in the first pipeline part.

3. The heat dissipation apparatus according to claim 2, wherein the first pipeline part includes:

a first limiting chamber in a middle of the first pipeline part, communicating with the first end of the second pipeline part;

a first port, connected to the first limiting chamber and the first end of the first branch pipeline respectively, a cross-sectional area of the first port being smaller than a cross-sectional area of the first limiting chamber;

a second port, connected to the first limiting chamber and the first end of the second branch pipeline respectively, a cross-sectional area of the second port being smaller than the cross-sectional area of the first limiting chamber; and the moving member being capable of movably arranged in the first limiting chamber.

4. The heat dissipation apparatus according to claim 3, wherein:

when the moving member moves to and reaches a first limit position of the first limiting chamber, the moving member blocks the first port;

when the moving member moves to and reaches the second limit position of the first limiting chamber, the moving member blocks the second port; and when the moving member moves and is positioned between the first limit position and the second limit position of the first limiting chamber, the output pipeline establishes communication with the first branch pipeline and the second branch pipeline simultaneously.

5. The heat dissipation apparatus according to claim 2, wherein:

a length of a first port of the second pipeline part in a first direction is greater than a length of a second port of the second pipeline part in the first direction; and a chamber of the second pipeline part is flat, and a height of the second pipeline part in a second direction is smaller than a height of the moving member.

6. The heat dissipation apparatus according to claim 1, further comprising:

an input pipeline, a first end of the input pipeline being connected to a second end of the second branch pipeline and a second end of the first branch pipeline respectively;

a first heat dissipation block, for dissipating heat for the first heating element, including a first heat dissipation chamber, a first inlet and a first outlet, two sections of the first branch pipeline being connected to the first inlet and the first outlet respectively;

a second heat dissipation block, for dissipating heat for the second heating element, including a second heat dissipation chamber, a second inlet and a second outlet, two sections of the first branch pipeline being connected to the first inlet and the first outlet respectively;

a first filter member, at the first outlet; and a second filter member, at the second outlet.

7. The heat dissipation apparatus according to claim 1, wherein the moving member can move within the connection pipeline based on a pressure of the heat dissipation medium in the first branch pipeline and a pressure of the heat dissipation medium in the second branch pipeline.

8. The heat dissipation apparatus according to claim 1, wherein:

the moving member is a columnar structure or a spherical structure; and filter structures are arranged at two ends of the connection pipeline.

9. The heat dissipation apparatus according to claim 2, wherein:

the moving member is a columnar structure or a spherical structure; and filter structures are arranged at two ends of the connection pipeline.

10. The heat dissipation apparatus according to claim 3, wherein:

the moving member is a columnar structure or a spherical structure; and filter structures are arranged at two ends of the connection pipeline.

11. The heat dissipation apparatus according to claim 4, wherein:

the moving member is a columnar structure or a spherical structure; and filter structures are arranged at two ends of the connection pipeline.

12. The heat dissipation apparatus according to claim 5, wherein:

the moving member is a columnar structure or a spherical structure; and filter structures are arranged at two ends of the connection pipeline.

13. An electronic device, comprising:

the first heating element, a second heating element, and the heat dissipation apparatus according to claim 1.

14. The electronic device according to claim 13, wherein the connection pipeline includes:

a first pipeline part, two ports of the first pipeline part being respectively connected to a first end of the second branch pipeline and a first end of the first branch pipeline;

a second pipeline part, a first end of the second pipeline part being connected to a side wall of the first pipeline part, and a second end of the second pipeline part being connected to the output pipeline; and the moving member being capable of movably arranged in the first pipeline part.

15. The electronic device according to claim 14, wherein the first pipeline part includes:

a first limiting chamber in a middle of the first pipeline part, communicating with the first end of the second pipeline part;

a first port, connected to the first limiting chamber and the first end of the first branch pipeline respectively, a cross-sectional area of the first port being smaller than a cross-sectional area of the first limiting chamber;

a second port, connected to the first limiting chamber and the first end of the second branch pipeline respectively, a cross-sectional area of the second port being smaller than the cross-sectional area of the first limiting chamber; and the moving member being movably arranged in the first limiting chamber.

16. The electronic device according to claim 15, wherein:

when the moving member moves to and reaches a first limit position of the first limiting chamber, the moving member blocks the first port;

when the moving member moves to and reaches the second limit position of the first limiting chamber, the moving member blocks the second port; and when the moving member moves and is positioned between the first limit position and the second limit position of the first limiting chamber, the output pipeline establishes communication with the first branch pipeline and the second branch pipeline respectively.

17. The electronic device according to claim 14, wherein:

a length of a first port of the second pipeline part in a first direction is greater than a length of a second port of the second pipeline part in the first direction; and a chamber of the second pipeline part is flat, and a height of the second pipeline part in a second direction is smaller than a height of the moving member.

18. The electronic device according to claim 15, wherein the first heating element is a first processor, and the second heating element is a second processor.

19. A heat dissipation apparatus, comprising:

a first branch pipeline, capable of accommodating a heat dissipation medium and configured for dissipating heat for a first heating element;

a second branch pipeline, capable of accommodating the heat dissipation medium and configured for dissipating heat for a second heating element;

a connection pipeline, two ends of the connection pipeline being connected to the first branch pipeline and the second branch pipeline respectively, including:

a first pipeline part, two ports of the first pipeline part being respectively connected to a first end of the second branch pipeline and a first end of the first branch pipeline; and a second pipeline part, a first end of the second pipeline part being connected to a side wall of the first pipeline part, and a second end of the second pipeline part being connected to an output pipeline;

the output pipeline, connected to the connection pipeline; and a moving member, movably arranged in the first pipeline part and capable of moving toward the first branch pipeline side or the second branch pipeline side in the first pipeline part to adjust a communication area between the first branch pipeline and the output pipeline and a communication area between the second branch pipeline and the output pipeline;

wherein:

a length of a first port of the second pipeline part in a first direction is greater than a length of a second port of the second pipeline part in the first direction; and a chamber of the second pipeline part is flat, and a height of the second pipeline part in a second direction is smaller than a height of the moving member.

20. A heat dissipation apparatus, comprising:

a first branch pipeline, capable of accommodating a heat dissipation medium and configured for dissipating heat for a first heating element;

a second branch pipeline, capable of accommodating the heat dissipation medium and configured for dissipating heat for a second heating element;

a connection pipeline, two ends of the connection pipeline being connected to the first branch pipeline and the second branch pipeline respectively;

an output pipeline, connected to the connection pipeline; and a moving member, movably arranged in the connection pipeline and capable of moving toward the first branch pipeline side or the second branch pipeline side in the connection pipeline to adjust a communication area between the first branch pipeline and the output pipeline and a communication area between the second branch pipeline and the output pipeline;

wherein the moving member is configured to move within the connection pipeline based on a pressure of the heat dissipation medium in the first branch pipeline and a pressure of the heat dissipation medium in the second branch pipeline.

* * * * *